(12) United States Patent
Hirochi et al.

(10) Patent No.: US 9,018,689 B1
(45) Date of Patent: Apr. 28, 2015

(54) SUBSTRATE PROCESSING APPARATUS AND METHOD OF MANUFACTURING SEMICONDUCTOR DEVICE

(71) Applicant: Hitachi Kokusai Electric Inc., Tokyo (JP)

(72) Inventors: Yukitomo Hirochi, Toyama (JP); Naofumi Ohashi, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 14/230,513

(22) Filed: Mar. 31, 2014

(30) Foreign Application Priority Data

Dec. 27, 2013 (JP) ................................. 2013-271926

(51) Int. Cl.
*H01L 21/02* (2006.01)
(52) U.S. Cl.
CPC .... *H01L 21/02274* (2013.01); *H01L 21/02186* (2013.01)
(58) Field of Classification Search
CPC ................. H01L 21/28562; H01L 21/76843; H01L 21/02126; H01L 21/02216; H01L 21/02274; H01L 21/02351; H01L 21/0206; H01L 21/02063; H01L 21/02129; H01L 21/02167; H01L 21/02203; H01L 21/02211; H01L 21/02271; H01L 21/02282; H01L 21/02
USPC ...................... 257/E21.171, E21.029, E21.03, 257/E21.038, E21.09, E21.241, E21.242, 257/E21.26, E21.27, E21.271, E21.273, 257/E21.275, E21.277, E21.311, E21.586, 257/E21.595

See application file for complete search history.

(56) References Cited

U.S. PATENT DOCUMENTS

| | | | | |
|---|---|---|---|---|
| 5,683,547 A | * | 11/1997 | Azuma et al. | 438/695 |
| 6,162,709 A | * | 12/2000 | Raoux et al. | 438/513 |
| 8,038,858 B1 | * | 10/2011 | Bures et al. | 204/298.14 |
| 8,373,117 B2 | * | 2/2013 | Badiei et al. | 250/288 |
| 2005/0145333 A1 | * | 7/2005 | Kannan et al. | 156/345.24 |
| 2007/0275569 A1 | * | 11/2007 | Moghadam et al. | 438/781 |
| 2007/0299239 A1 | * | 12/2007 | Weigel et al. | 528/349 |
| 2009/0239085 A1 | * | 9/2009 | Ehara | 428/446 |
| 2012/0231486 A1 | * | 9/2012 | Lavold et al. | 435/23 |
| 2013/0284917 A1 | * | 10/2013 | Badiei et al. | 250/288 |

* cited by examiner

*Primary Examiner* — Stephen W Smoot
*Assistant Examiner* — Edward Chin
(74) *Attorney, Agent, or Firm* — Volpe and Koenig, P.C.

(57) ABSTRACT

A substrate processing apparatus includes a source gas supply system including a source gas supply pipe connected to a source gas source and a source gas supply controller; a reactive gas supply system including a reactive gas supply pipe connected to a reactive gas source, a reactive gas supply controller, a plasma generation unit and an ion trap unit and an inert gas supply pipe whereat an inert gas supply controller is disposed; a processing chamber supplied with a source gas by the source gas supply system and a reactive gas by the reactive gas supply system; and a control unit configured to control the gas supply controllers. The inert gas supply pipe has a downstream side connected between the reactive gas supply controller and the plasma generation unit and an upstream side connected to an inert gas supply source.

6 Claims, 8 Drawing Sheets

SUBSTRATE PROCESSING APPARATUS AND METHOD OF MANUFACTURING SEMICONDUCTOR DEVICE

CROSS-REFERENCE TO RELATED PATENT APPLICATION

This U.S. non-provisional patent application claims priority under 35 U.S.C. §119 of Japanese Patent Application No. 2013-271926 filed on Dec. 27, 2013 in the Japanese Patent Office, the entire contents of which are hereby incorporated by reference.

BACKGROUND OF THE INVENTION

1. Field of the Invention

The present invention relates to a substrate processing apparatus and a method of manufacturing a semiconductor device.

2. Description of the Related Art

Recently, semiconductor devices such as a flash memory tend to be highly integrated. Thus, a pattern size is significantly miniaturized. When forming the patterns of these semiconductor devices, a process of performing predetermined processing, such as oxidation or nitridation, on a substrate may be executed as part of a manufacturing process.

A method of forming the pattern includes forming a groove between circuits and then forming a liner film or wiring in the groove. This groove is configured to have a high aspect ratio due to recent miniaturization.

When the liner film is formed, the film is required to be formed to have good step coverage in which there is no deviation of film thicknesses at a top side, a middle side, a bottom side, and a base portion of the groove. By using a film having good step coverage, the characteristics of the semiconductor device may be made uniform in the groove, thereby avoiding deviation of characteristics of the semiconductor device.

To process a groove of a high aspect ratio, there have been attempts to utilize a heated gas or ionized gas (that is, plasma). In these cases, however, it is difficult to form a film having good step coverage.

To form the film, there is an alternate supply method, in which at least two processing gases, such as, a source gas and a reactive gas that reacts with the source gas, are alternately supplied to the substrate and a reaction between the two gases is performed to form a film. The alternate supply method is a method of performing a reaction between the source gas and the reactive gas on a surface of the substrate to form a single layer film and sequentially stacking such layers to form a film having a desired thickness. However, in order to prevent the reaction between the source gas and the reactive gas from being performed at a position other than on the surface of the substrate, before each gas is supplied, a purge process for removing a residual gas may be performed.

Also, the alternate supply method may be performed at a low temperature, depending on characteristics of a circuit formed on the substrate. In order to realize low-temperature processing, energy for promoting the reaction needs to be added to one of the gases. For example, the reactive gas is ionized to form plasma. Thus, a film can be formed to have good characteristics even at a low temperature.

SUMMARY OF THE INVENTION

The plasma processing allows promotion of reaction on the substrate, but has a problem such as damage or electrification due to ions. Accordingly, it is not a technique appropriate for a process that is sensitive to damage, such as a transistor manufacturing process. Also, the quality of the entire film that is formed is degraded because the ion damage occurs for each layer.

The present invention provides a substrate processing apparatus and a method of manufacturing a semiconductor device, which can form a high-quality film having little ion damage.

According to one aspect of the present invention, there is provided a substrate processing apparatus, including: a source gas supply system including a source gas supply pipe connected to a source gas source and a source gas supply controller disposed at the source gas supply pipe; a reactive gas supply system including: a reactive gas supply pipe connected to a reactive gas source, a reactive gas supply controller, a plasma generation unit and an ion trap unit, wherein the reactive gas supply controller, the plasma generation unit and the ion trap unit are arranged in order along a downstream direction of the reactive gas supply pipe; and an inert gas supply pipe whereat an inert gas supply controller is disposed, the inert gas supply pipe having a downstream side connected to the reactive gas supply pipe between the reactive gas supply controller and the plasma generation unit and an upstream side connected to an inert gas supply source; a processing chamber configured to accommodate a substrate to be processed, the processing chamber being supplied with a source gas by the source gas supply system and a reactive gas by the reactive gas supply system; and a control unit configured to control at least the source gas supply controller, the reactive gas supply controller and the inert gas supply controller.

According to another aspect of the present invention, there is provided a method of manufacturing a semiconductor device, including:

(a) loading a substrate into a processing chamber;

(b) supplying a source gas into the processing chamber by a source gas supply system; and (c) starting a supply of a reactive gas while an inert gas is supplied and supplying a mixture of the inert gas and the reactive gas into the processing chamber via a plasma generation unit and an ion trap unit disposed in a reactive gas supply system with the plasma generation unit and the ion trap unit operated.

DETAILED DESCRIPTION OF THE PREFERRED EMBODIMENTS

First Embodiment of the Present Invention

Figure 1:
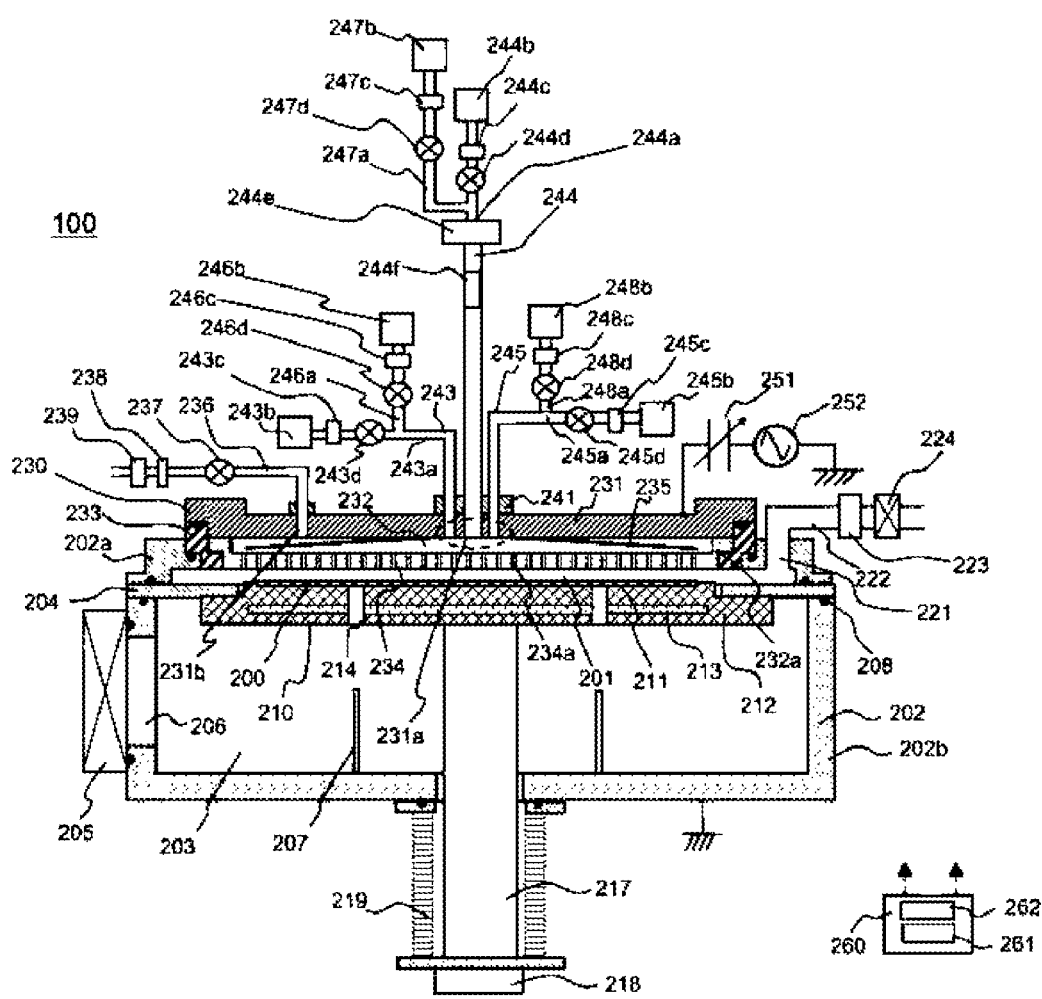
FIG. 1 is a cross-sectional view of a substrate processing apparatus according to an embodiment of the present invention.

Hereinafter, a substrate processing apparatus according to the first embodiment of the present invention will be described with reference to FIG. 1. FIG. 1 is a cross-sectional view of the substrate processing apparatus according to the embodiment.

(1) Configuration of Substrate Processing Apparatus

A substrate processing apparatus 100 according to the present embodiment will be described. The substrate processing apparatus 100 is an apparatus for forming a thin film, which is configured by a batch-type substrate processing apparatus, as shown in FIG. 1.

As shown in FIG. 1, the substrate processing apparatus 100 is provided with a processing container 202. For example, the processing container 202 is configured by a sealed container having a circular flat cross section. In addition, a sidewall or bottom wall of the processing container 202 is formed of, for example, a metal such as aluminum (Al), stainless steel (SUS), and so on. A processing chamber 201, where a wafer 200, such as a silicon wafer, is processed as a substrate, and a transfer chamber 203 are formed in the processing container 202. The processing container 202 includes an upper container 202a, a lower container 202b, and a shower head 230 which is a ceiling portion. A partition plate 204 is disposed between the upper container 202a and the lower container 202b. A space that is surrounded by the upper container 202a and the shower head 230 and positioned above the partition plate 204 is referred to as a processing space while a space that is surrounded by the lower container 202b and positioned below the partition plate 204 is referred to as a transfer space. The processing chamber 201 is configured by the upper container 202a and the shower head 230 to surround the processing space. The transfer chamber 203 surrounds the transfer space. An O-ring 208 is disposed between the chambers to airtightly seal the processing container 202.

A substrate loading/unloading port 206 is disposed adjacent to a gate valve 205 in the side of the lower container 202b, and the wafer is transferred to the transfer chamber (not shown) through the substrate loading/unloading port 206. A plurality of lift pins 207 are disposed in the bottom portion of the lower container 202b. In addition, the lower container 202b is grounded.

A substrate support part 210 (also referred to as a substrate placing part) for supporting the wafer is positioned in the processing chamber 201. The substrate support part 210 mainly includes a placing surface 211 on which the wafer 200 is placed, a substrate placing table 212 having the placing surface 211 thereon, and a substrate placing table heater 213 (also referred to as a first heater) as a heating source for heating wafers contained on the substrate placing table 212. In the substrate placing table 212, a plurality of through holes 214, through which the plurality of lift pins 207 pass, are disposed to correspond to the plurality of lift pins 207.

The substrate placing table 212 is supported by a shaft 217. The shaft 217 is connected to a lifting mechanism 218 outside the processing container 202 through a bottom portion of the processing container 202. The wafer 200 that is loaded on the substrate placing surface 211 may be lifted by operating the lifting mechanism 218 to lift the shaft 217 and the supporting table 212. In addition, the processing container 202 is airtightly held by coating lower ends of the shaft 217 with bellows 219.

The substrate placing table 212 descends such that the substrate placing surface 211 may be positioned at a position (that is, a wafer transfer position) of the substrate loading/unloading port 206 when the wafer 200 is transferred. The wafer 200 is lifted to a processing position (that is, a wafer processing position) in the processing chamber 201 when the wafer 200 is processed, as shown in FIG. 1.

Specifically, when the substrate placing table 212 descends to the wafer transfer position, an upper end of the lift pin 207 protrudes from a top surface of the substrate placing table 212, and thus the lift pin 207 supports the wafer 200 from a lower portion. In addition, when the substrate placing table 212 is lifted to the wafer processing position, the lift pin 207 is buried from the top surface of the substrate placing table 212, and thus the substrate placing surface 211 supports the wafer 200 from a lower portion. In addition, the lift pin 207 is preferably formed of, for example, quartz or alumina since the lift pin 207 is in direct contact with the wafer 200.

[Gas Introduction Hole]

A gas introduction hole 241 for supplying various gases into the processing chamber 201 is disposed on a top surface (that is, a ceiling wall) of the shower head 230 to be described later, which is disposed on a top portion of the processing chamber 201. A configuration of a gas supply system connected to the gas introduction hole 241 will be described later.

[Shower Head]

A shower head 230 serving as a gas dispersion mechanism communicating with the processing chamber 201 is disposed between the gas introduction hole 241 and the processing chamber 201. That is, the shower head 230 is disposed in an upstream direction in the processing chamber 201. The gas introduction hole 241 is connected to a cap 231 of the shower head 230. A gas introduced from the gas introduction hole 241 is supplied to a buffer space in a buffer chamber 232 of the shower head 230, through a hole 231a disposed in the cap 231. That is, the cap 231 is disposed upstream in a gas supply direction from the buffer chamber 232. The buffer chamber 232 is formed on a lower end of the cap 231 and an upper end of a dispersion plate 234. That is, the dispersion plate 234 is disposed downstream in the gas supply direction (here, a direction of the processing chamber) from the buffer chamber.

The cap 231 of the shower head is formed of a metal with high thermal conductivity and electrical conductivity and used as an electrode for generating plasma in the buffer space of the buffer chamber 232 or a space in the processing chamber 201. An insulation block 233 is disposed between the cap 231 and the upper container 202a and configured to insulate between the cap 231 and the upper container 202a.

The shower head 230 is provided with the dispersion plate 234 for dispersing the gas introduced from the gas introduction hole 241, between the space in the buffer chamber 232 and the processing space in the processing chamber 201. A plurality of through holes 234a are disposed in the dispersion plate 234. The dispersion plate 234 is disposed to face the substrate placing surface 211. The dispersion plate includes a protruding part having the through holes 234a disposed thereon and a flange part disposed around the protruding part. The flange part is supported by the insulation block 233.

A gas guide 235 is disposed in the buffer chamber 232 to form a flow of a supplied gas. The gas guide 235 has the shape of a cone, which has the hole 231a formed on the cap 231 as a vertex point and an increasing diameter toward the dispersion plate 234. A horizontal diameter of a lower end of the gas guide 235 is formed outside of an outermost boundary of a set of the through holes 234a.

An exhaust pipe 236 is connected to the upper portion of the buffer chamber 232 through a shower head exhaust hole 231b. A valve 237 for switching exhaust on/off, a pressure regulator 238, such as an auto pressure controller (APC), for performing control so as to maintain a pressure inside the buffer chamber 232 within a predetermined range, and a vacuum pump 239 are sequentially connected in series to the exhaust pipe 236.

Since the exhaust hole 231b is disposed above the gas guide 235, in a shower head exhaust process to be described later, a gas flows as follows. An inert gas that is supplied from a supply hole 231a formed on the cap 231 is dispersed by the gas guide 235 to flow through a center portion and a lower portion of the buffer chamber 232. Then, the inert gas turns in an end portion of the gas guide and is exhausted from the exhaust hole 231b. The exhaust pipe 236, the valve 237, and the pressure regulator 238 are collectively referred to as a first supply system.

(Supply System)

A first-element-containing gas is mainly supplied from a first gas supply system 243 including a first gas supply pipe 243a while a second-element-containing gas is supplied from a second gas supply system 244 including a second gas supply pipe 244a. An inert gas is mainly supplied when a wafer is processed and a cleaning gas is mainly supplied when the processing chamber is cleaned from a third gas supply system 245 including a third gas supply pipe 245a.

(First Gas Supply System)

A first gas supply source 243b, a mass flow controller (MFC) 243c serving as a flow rate controller (that is, a flow rate control unit), and a valve 243d serving as a shut-off valve are disposed sequentially in the first gas supply pipe 243a from an upstream end. The mass flow controller 243c and the valve 243d are collectively referred to as a source gas supply controller.

A gas containing a first element (hereinafter referred to as a first-element-containing gas) which flows through the first gas supply pipe 243a is supplied to the shower head 230 through the mass flow controller 243c, the valve 243d, and a common gas supply pipe (not shown).

The first-element-containing gas is one of sources gases, that is, processing gases. Accordingly, the first gas supply system is also referred to as a source gas supply system. Hereinafter, a first gas may be referred to as a source gas when the word "first gas" is included in a name of a component, such as the first gas supply source.

Here, the first element is, for example, titanium (Ti). That is, the first-element-containing gas is, for example, a titanium-containing gas. For example, a $TiCl_4$ gas may be used as the titanium-containing gas. In addition, the first-element-containing gas may exist in three forms: solid, liquid, or gas at room temperature and atmospheric pressure. If the first-element-containing gas is a liquid at room temperature and atmospheric pressure, a vaporizer (not shown) may be disposed between the first gas supply source 243b and the mass flow controller 243c. Here, it is assumed that the first-element-containing gas is a gas.

Alternatively, a silicon-containing gas may be used. For example, hexamethyldisilazane (HMDS; $C_6H_{19}NSi_2$), trisilylamine (TSA; $(SiH_3)_3N$), or bis(tertiary-butylamino)silane (BTBAS; $SiH_2[NH(C_4H_9)]_2$) gas, which are organic silicon materials, may be used as the silicon-containing gas. The gas acts as a precursor.

A downstream end of a first inert gas supply pipe 246a is connected to the first gas supply pipe 243a downstream from the valve 243d. An inert gas supply source 246b, a mass flow controller (MFC) 246c serving as a flow rate controller (that is, a flow rate control unit), and a valve 246d serving as a shut-off valve are disposed sequentially in the first inert gas supply pipe 246a from an upstream end. The mass flow controller 246c and the valve 246d are collectively referred to as a first inert gas supply controller.

Here, the inert gas is, for example, nitrogen ($N_2$) gas. A noble gas, such as helium (He), neon (Ne), and argon (Ar), may be used instead of the $N_2$ gas as the inert gas.

The inert gas flowing through the first inert gas supply pipe 246a is supplied to the shower head 230 through the mass flow controller 246c, the valve 246d, and the first gas supply pipe 243a. The inert gas acts as a carrier gas, dilution gas, or backflow prevention gas in a thin-film forming process S104 to be described later.

The first-element-containing gas supply system 243 (also referred to as a titanium-containing gas supply system) is mainly configured by the first gas supply pipe 243a, the main flow controller 243c, and the valve 243d.

In addition, the first inert gas supply system is mainly configured by the first inert gas supply pipe 246a, the mass flow controller 246c, and the valve 246d. The first gas supply source 243b and the first gas supply pipe 243a may be considered to be included in the first inert gas supply system.

The first gas supply source 243b and the first inert gas supply system may be considered to be included in the first-element-containing gas supply system.

(Second Gas Supply System)

A second gas supply source 244b, a mass flow controller (MFC) 244c serving as a flow rate controller (that is, a flow rate control unit), a valve 244d serving as a shut-off valve, a remote plasma unit 244e, and an ion trap unit 244f are disposed sequentially in the second gas supply pipe 244a sequentially from an upstream end.

A gas containing a second element (hereinafter referred to as a second-element-containing gas) which flows through the second gas supply pipe 244a is supplied into the shower head 230 through the mass flow controller 244c, the valve 244d, the remote plasma unit 244e, and the ion trap unit 244f. The second-element-containing gas is ionized into plasma by the remote plasma unit 244e and sprayed on the wafer 200.

The remote plasma unit 244e serving as a plasma generation unit is configured by a coil, a matching box, a power source, etc. to generate plasma, for example, in an inductive coupling plasma (IPC) scheme. As will be described below, the power source or matching box is previously adjusted in consideration of the type of gas or the range of pressure to generate plasma having fewer ions and more radicals when the second-element-containing gas is passed.

The second-element-containing gas is one of processing gases. Alternatively, the second-element-containing gas may be considered as a reactive gas or reforming gas. Accordingly, the second gas supply system is also referred to as a reactive gas supply system. Hereinafter, a second gas may be referred to as a reactive gas when the word "second gas" is included in a name of a component, such as the second gas supply source.

Here, the second-element-containing gas contains a second element that is different from the first element. The second element is one of, for example, oxygen (O), nitrogen (N), and carbon (C). In the present embodiment, the second-element-containing gas is, for example, a nitrogen-containing gas. Specifically, ammonia ($NH_3$) gas is used as the nitrogen-containing gas.

The second-element-containing gas supply system 244 (also referred to as a nitrogen-containing gas supply system) is mainly configured by the second gas supply pipe 244a, the main flow controller 244c, and the valve 244d. The mass flow controller 244c and the valve 244d are collectively referred to as a reactive gas supply controller.

In addition, a downstream end of a second inert gas supply pipe 247a is combined to the second gas supply pipe 244a downstream from the valve 244d. An inert gas supply source 247b, a mass flow controller (MFC) 247c serving as a flow rate controller (that is, a flow rate control unit), and a valve 247d serving as a shut-off valve are disposed sequentially in the second inert gas supply pipe 247a from an upstream end. The mass flow controller 247c and the valve 247d are collectively referred to as a second inert gas supply controller.

The inert gas flowing through the second inert gas supply pipe 247a is supplied into the shower head 230 through the mass flow controller 247c, the valve 247d, the second remote plasma unit 244e, and an ion trap unit 244f. The inert gas acts as a carrier gas, dilution gas, or backflow prevention gas in the film forming process (also referred to as a thin-film forming process) S104 to be described later.

The second inert gas supply system is mainly configured by the second inert gas supply pipe 247a, the mass flow controller 247c, and the valve 247d. In addition, the inert gas supply source 247b, the second gas supply pipe 244a, the remote plasma unit 244e, and the ion trap unit 244f may be considered to be included in the second inert gas supply system.

The second gas supply source 244b, the remote plasma unit 244e, the ion trap unit 244f, and the second inert gas supply system may be considered to be included in the second-element-containing gas supply system 244.

(Third Gas Supply System)

A third gas supply source 245b, a mass flow controller (MFC) 245c serving as a flow rate controller (that is, a flow rate control unit), and a valve 245d serving as a shut-off valve are disposed sequentially in the third gas supply pipe 245a from an upstream end.

The inert gas (nonreactive gas) is supplied as a purge gas from the third gas supply source 245b to the shower head 230 through the mass flow controller 245c, the valve 245d, and the third gas supply pipe 245a.

Here, the inert gas is, for example, nitrogen ($N_2$) gas. A noble gas such as helium (He) may be used instead of the $N_2$ gas as the inert gas.

A third gas supply source 245b, a mass flow controller (MFC) 245c serving as a flow rate controller (that is, a flow rate control unit), and a valve 245d serving as a shut-off valve are disposed sequentially in the third gas supply pipe 245a from an upstream end.

A downstream end of a cleaning gas supply pipe 248a is connected to the third gas supply pipe 245a downstream from the valve 245d. A cleaning gas supply source 248b, a mass flow controller (MFC) 248c serving as a flow rate controller (that is, a flow rate control unit), and a valve 248d serving as a shut-off valve are disposed sequentially in the cleaning gas supply pipe 248a from an upstream end.

The third gas supply system is mainly configured by the third gas supply pipe 245a, the mass flow controller 245c, and the valve 245d.

In addition, the cleaning gas supply system is mainly configured by the cleaning gas supply pipe 248a, the mass flow controller 248c, and the valve 248d. The cleaning gas supply source 248b and the third gas supply pipe 245a may be considered to be included in the cleaning gas supply system.

Alternatively, the third gas supply source 245b and the cleaning gas supply system may be considered to be included in the third gas supply system 245.

In a substrate processing process, the inert gas flowing through the third gas supply pipe 245a is supplied into the shower head 230 through the mass flow controller 245c and the valve 245d. In a cleaning process, a cleaning gas flowing through the third gas supply pipe 245a is supplied into the shower head 230 through the mass flow controller 248c and the valve 248d.

The inert gas supplied from the third gas supply source 245b may act as a purge gas for purging a residual gas in the processing chamber 201 or shower head 230 in the thin-film forming process S104 to be described later and act as a carrier gas or dilution gas of the cleaning gas in a cleaning process.

The cleaning gas supplied from the cleaning gas supply source 248b acts as a cleaning gas for removing a byproduct adhering to the shower head 230 or processing chamber 201 in the cleaning process.

Here, the cleaning gas is, for example, nitrogen trifluoride ($NF_3$) gas. Alternatively, hydrogen fluoride (HF) gas, chlorine trifluoride ($ClF_3$) gas, fluorine ($F_2$) gas, or a combination thereof may be used as the cleaning gas.

(Second Exhaust System)

An exhaust port 221 exhausting an atmosphere inside the processing chamber 201 is disposed at a side of an inner wall of the processing chamber 201 (upper container 202a). An exhaust pipe 222 is connected to the exhaust port 221. A pressure regulator 223, such as an auto pressure controller (APC), for performing a control so as to maintain a pressure inside the processing chamber 201 within a predetermined range, and a vacuum pump 239 are sequentially connected in series to the exhaust pipe 222. A second exhaust system 220 (that is, an exhaust line) is mainly configured by the exhaust port 221, the exhaust pipe 222, the pressure regulator 223, and the vacuum pump 239.

(Plasma Generation Structure)

A matching device 251 and a high-frequency power source 252 are connected to the cap 231 of the shower head. Plasma is generated in the shower head 230 and the processing chamber 201 by the high-frequency power source 252, the matching device 251 and impedance adjustment by the frequency variation.

(Controller)

The substrate processing apparatus 100 includes a controller 260 for controlling an operation of each part of the substrate processing apparatus 100. The controller 260 at least includes an operation part 261 and a memory part 262. The controller 260 calls a program or control recipe of the substrate processing apparatus from the memory part according to an indication of the controller or a user, and controls each configuration according to the content thereof.

(2) Substrate Processing Process

Figure 2:
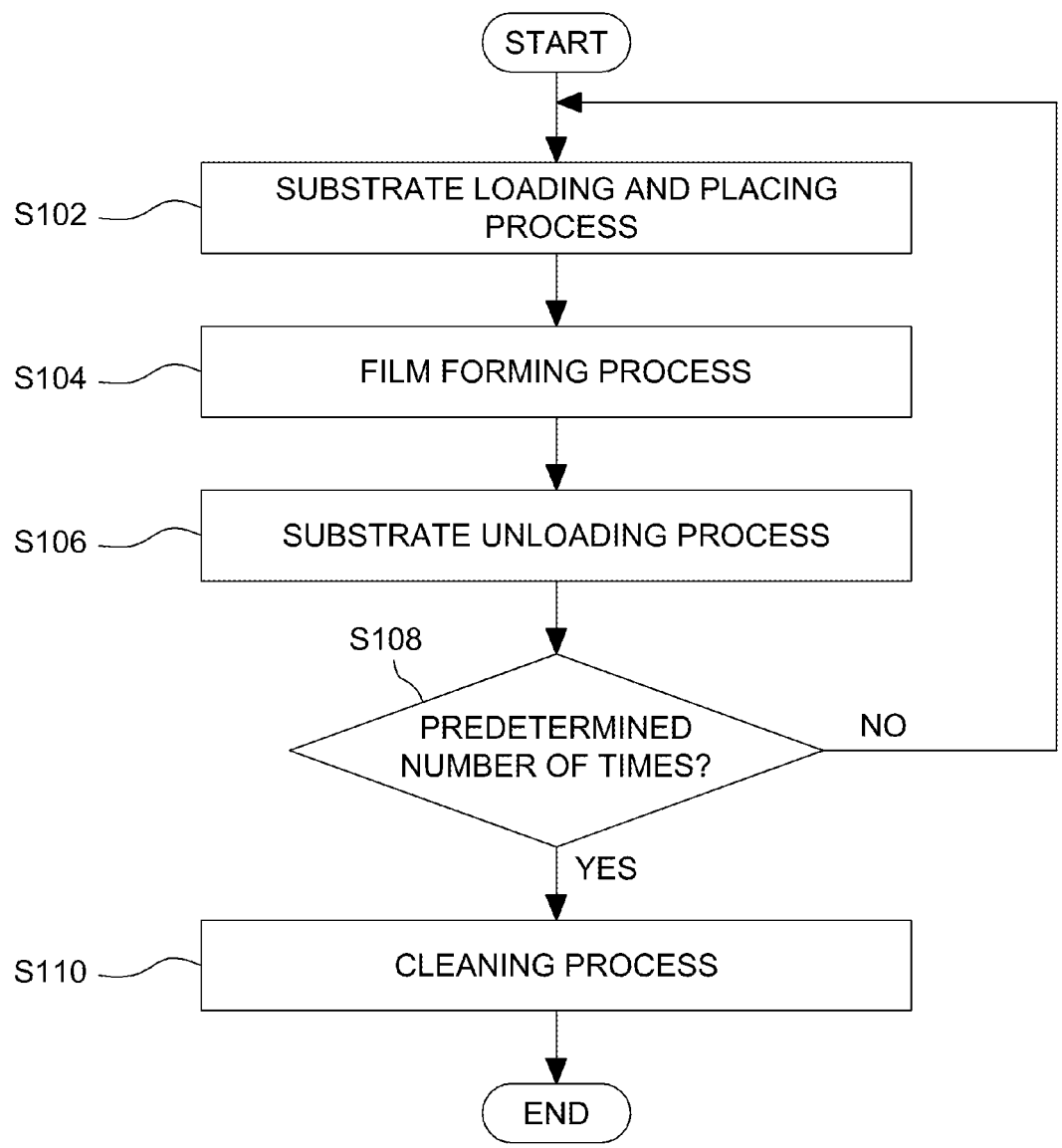
FIG. 2 is a flowchart illustrating a substrate processing process according to an embodiment of the present invention.
Figure 3:
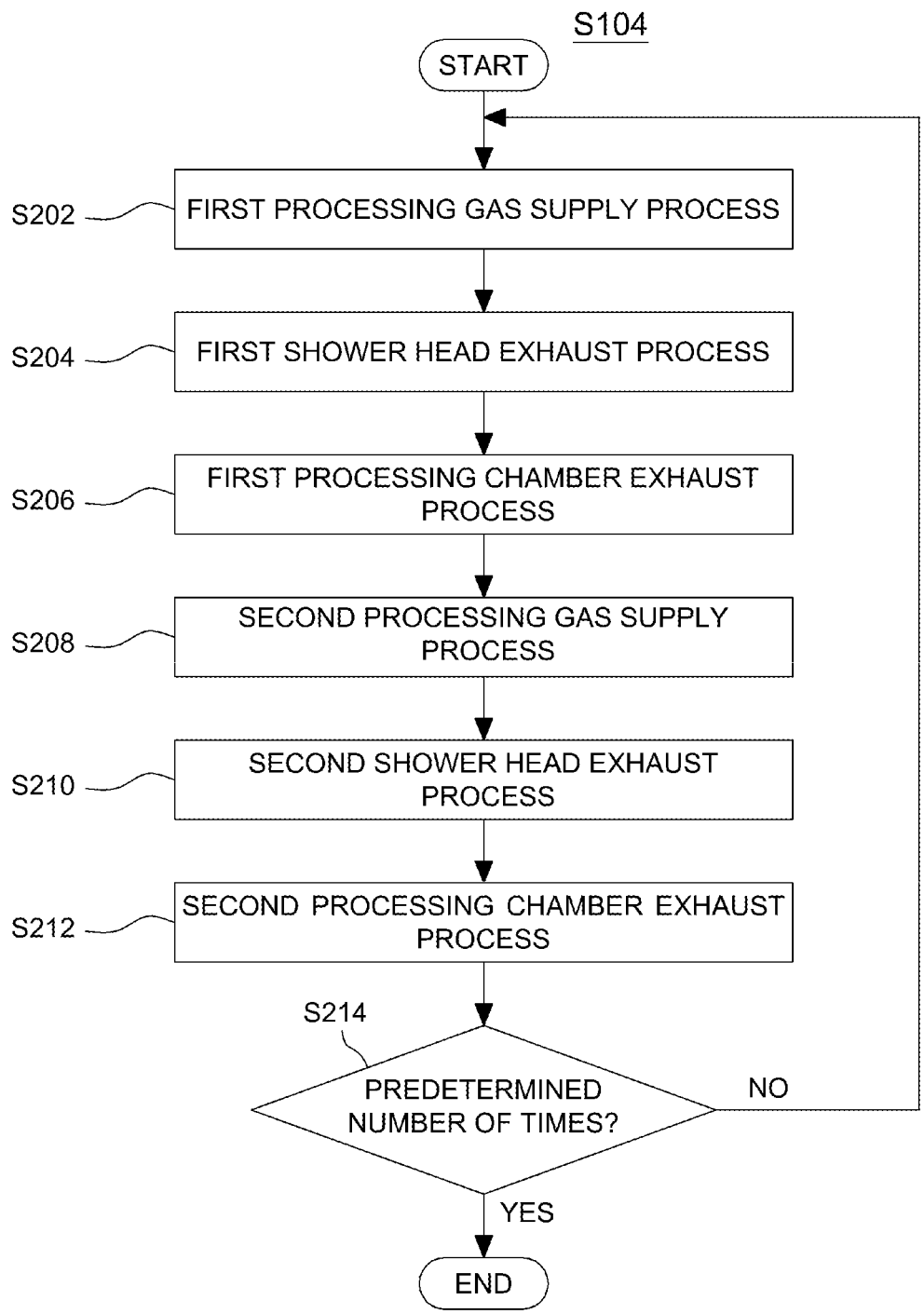
FIG. 3 is a view illustrating a gas supplying timing in a film forming process according to an embodiment of the present invention.
Figure 4:
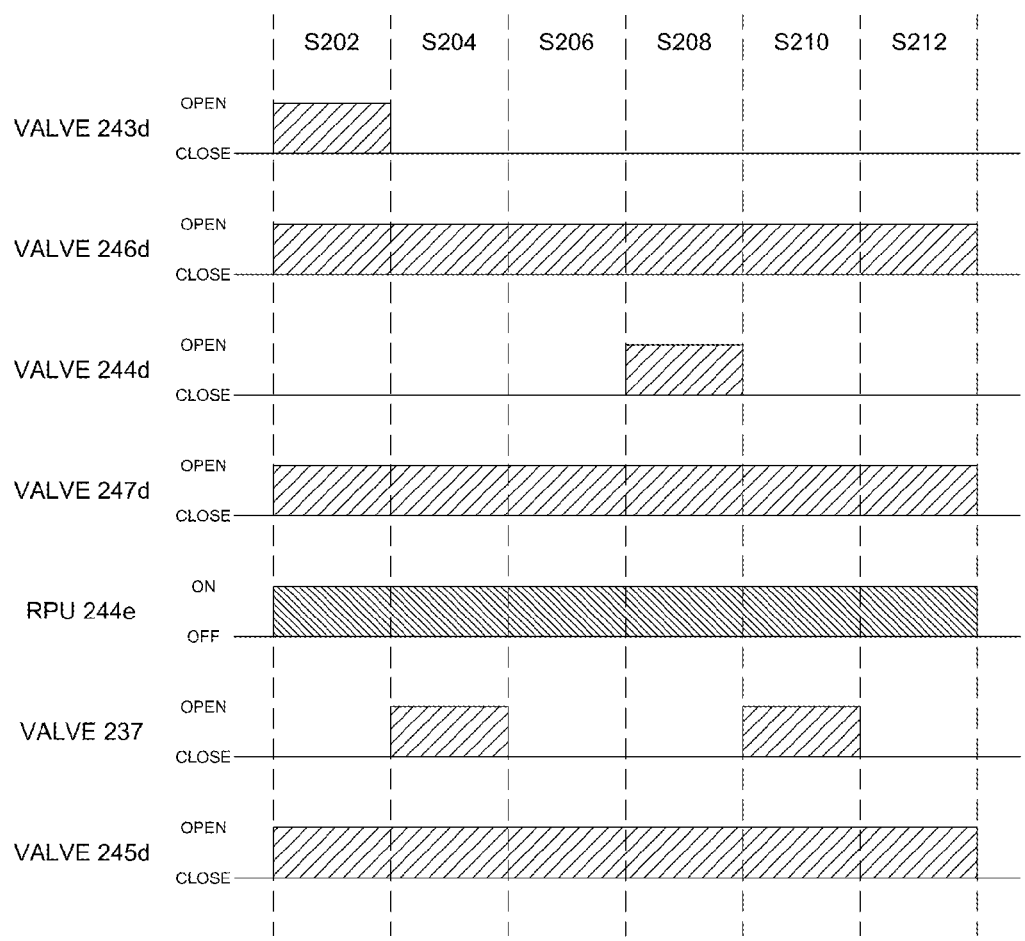
FIG. 4 is a flowchart showing a film forming process according to an embodiment of the present invention.
Figure 5:
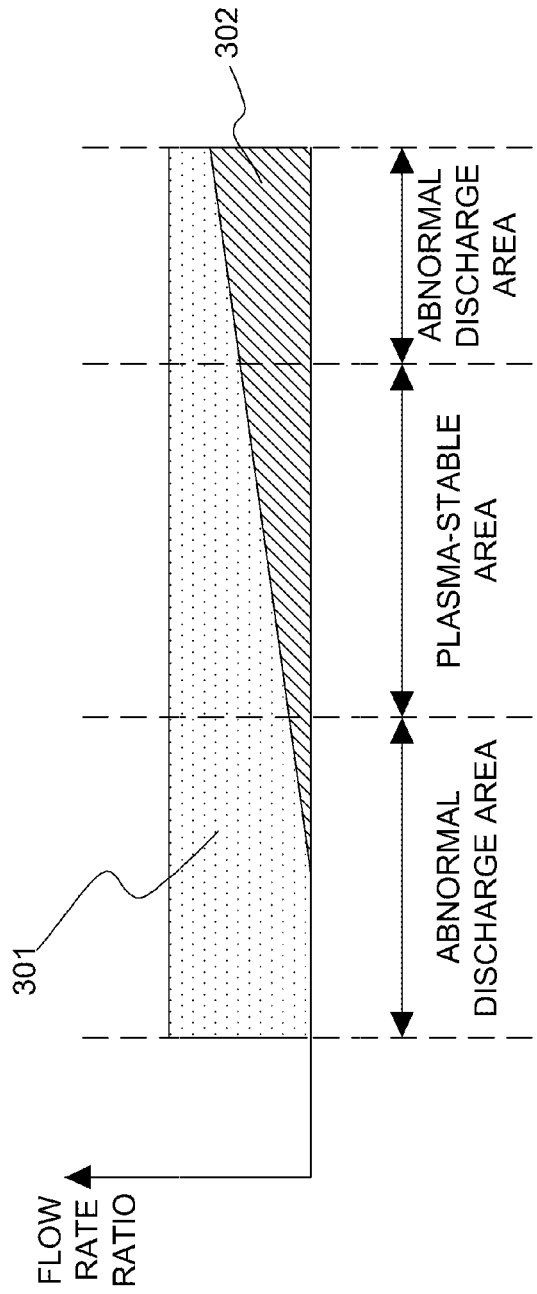
FIG. 5 is a view illustrating a situation in which gases are mixed according to an embodiment of the present invention.

Next, a process of forming a thin film on the wafer 200 using the substrate processing apparatus 100 will be described with reference to FIGS. 2 to 5. FIGS. 2 to 4 are flowcharts showing a film forming process according to an embodiment of the present invention. FIG. 5 is a view showing a relation between a gas mixture state and a plasma state in the remote plasma unit 244e. In addition, the operation of each part constituting the substrate processing apparatus 100, which will be described later, is controlled by the controller 260.

The substrate processing process will be schematically described with reference to FIGS. 2 to 4. FIG. 2 is a flowchart showing a substrate processing process according to an embodiment of the present invention.

Here, an example of forming a titanium nitride film as a thin film on the wafer 200 using $TiCl_4$ gas as a first-element-containing gas and ammonia ($NH_3$) gas as a second-element-containing gas will be described. Alternatively, a predetermined film may be previously formed on the wafer 200. In addition, a predetermined pattern may be previously formed on the wafer 200 or the predetermined film.

(Substrate Loading and Placing Process S102)

The substrate processing apparatus 100 allows the lift pin 207 to pass through the through hole 214 of the substrate placing table 212 by lowering the substrate placing table 212 to a transfer position of the wafer 200. As a result, the lift pin 207 protrudes from a surface of the substrate placing table 212 by a predetermined height. Then, the gate valve 205 is opened, the wafer 200 (that is, a substrate) is loaded into the processing chamber using a wafer transfer machine (not shown), and the wafer 200 is transferred on the lift pin 207. Thus the wafer 200 is horizontally supported on the lift pin 207 which protrudes from the surface of the substrate placing table 212.

When the wafer 200 is loaded into the processing container 202, the wafer transfer machine is drawn out of the processing container 202, and the gate valve 205 is closed to airtightly seal the processing container 202. Then, the wafer 200 is placed on the substrate placing surface 211 disposed on the substrate placing table 212 by lifting the substrate placing table 212.

In addition, when the wafer is loaded into the processing container 202, an atmosphere in the processing container 202 is exhausted by the exhaust system while $N_2$ gas is supplied as an inert gas in the processing container 202 from the inert gas supply system. That is, while the atmosphere in the processing container 202 is exhausted by operating the vacuum pump 239 to open the APC valve 223, the $N_2$ gas is preferably supplied into the processing container 202 by opening the valve 245d of the third gas supply system. Thus, it is possible to prevent invasion of particles into the processing container 202 and prevent particles from adhering to the wafer 200. In addition, the vacuum pump 239 is always operated from the substrate loading and placing process S102 to a substrate unloading process S106 to be described later.

When the wafer 200 is placed on the substrate placing table 212, power is supplied to the heater 213 embedded in the substrate placing table 121, and the surface of the wafer 200 is controlled at a predetermined temperature. The temperature of the wafer 200 is, for example, room temperature to 500° C., preferably, room temperature to 400° C. In this case, the temperature of the heater 213 is adjusted by controlling application of an electric current to the heater on the basis of temperature information that is detected by a temperature sensor (not shown).

(Film Forming Process S104)

Next, the thin-film forming process S104 is performed. A basic flow of the thin-film forming process S104 will be described first, and then a feature point of the present embodiment will be described in detail.

In the film forming process S104, $TiCl_4$ gas is supplied into the processing chamber 201 through the buffer chamber 232 of the shower head 230. When a predetermined time has elapsed after the $TiCl_4$ gas starts to be supplied, the supply of the $TiCl_4$ gas is stopped, and the $TiCl_4$ gas is exhausted by a purge gas from the buffer chamber 232 and the processing chamber 201.

After the $TiCl_4$ gas is exhausted, ionized ammonia gas (that is, plasma) is supplied into the processing chamber 201 through the buffer chamber 232. The ammonia gas reacts with a titanium-containing film formed on the wafer 200 and thus a titanium nitride film is formed as a thin film. After a predetermined time has elapsed, the supply of the ammonia gas is stopped, and the ammonia gas is exhausted by a purge gas from the shower head 230 and the processing chamber 201.

In the film forming process S104, the titanium nitride film having a predetermined thickness is formed by repeating the above-mentioned processing.

(Substrate Unloading Process S106)

Next, the substrate placing table 212 is lowered, and then the wafer 200 is supported on the lift pin 207 that protrudes from the surface of the substrate placing table 212. Then, the gate valve 205 is opened, and then the wafer 200 is unloaded from the processing container 202 using the wafer transfer machine. When the substrate processing process is completed, the supply of the inert gas from the third gas supply system into the processing container 202 is stopped.

(Processing Number Determination Process S108)

After the substrate is unloaded, it is determined whether the number of times the thin-film forming process is performed has reached a predetermined number of times. If it is determined that the predetermined number of times has been reached, the process proceeds to a cleaning process. If it is not determined that the predetermined number of times has been reached, the process proceeds to the substrate loading and placing process S102 in order to start the processing of a waiting wafer 200.

(Cleaning Process S110)

If it is determined in the processing number determination process S108 that the number of times the thin-film forming process is performed has reached a predetermined number of times, the cleaning process is performed. Here, the valve 248d of the cleaning gas supply system is opened, and the cleaning gas is supplied to the processing chamber 201 through the shower head 230.

When the cleaning gas is supplied to the shower head 230 and the processing chamber 201, plasma of the cleaning gas is generated in the shower head 230 and the processing chamber 201 by applying power to the high-frequency power source 252 and adjusting impedance using the matching device. The generated cleaning gas plasma removes a byproduct adhering to a wall of the shower head 230 or the processing chamber 201.

Hereinafter, the film forming process S104 will be described in detail with reference to FIGS. 3 to 5.

(First Processing Gas Supply Process S202)

The processing is started after the substrate placing table heating part 213 serving as a heating part according to the present embodiment is energized. When the substrate has reached a desired temperature, the valve 243d is opened, and the $TiCl_4$ gas starts to be supplied as a first processing gas into the processing chamber 201 through the gas introduction hole 241, the buffer chamber 232, and the plurality of through holes 234a.

The second gas supply system starts up the remote plasma unit 244e. In addition, the second gas supply system opens the valve 247d while the valve 244d is maintained closed. Thus, the reactive gas is not supplied to the processing chamber 201, and the carrier gas, which is an inert gas, is supplied through the remote plasma unit 244e and the ion trap unit 244f. The backflow from the shower head 230 is prevented by continuously supplying the inert gas from the second gas supply system.

The third gas supply system opens the valve 245d to start supplying an inert gas as a third processing gas into the processing chamber 201 through the gas introduction hole 241, the buffer chamber 232, and the plurality of through holes 234a.

$TiCl_4$ gas is uniformly dispersed in the buffer chamber 232 by the gas guide 235. The uniformly dispersed gas is uniformly supplied to the wafer 200 in the processing chamber 201 through the plurality of through holes 234a.

In this case, the mass flow controller 243c is adjusted such that a flow rate of the TiCl$_4$ gas serving as the first processing gas may be equal to a predetermined flow rate. In addition, the mass flow controller 245c is adjusted such that a flow rate of the inert gas serving as the third processing gas may be equal to a predetermined flow rate. For example, the supplied flow rate of TiCl$_4$ is 10 to 1,000 sccm. Also, in addition to the TiCl$_4$ gas, N$_2$ gas may be flowed as a carrier gas from the first inert gas supply system. Also, a pressure in the processing container 202 is maintained at a predetermined level by operating the exhaust pump 224 to appropriately adjust an opening degree of the APC valve 223.

The TiCl$_4$ gas is supplied to the wafer 200. A titanium-containing layer is formed as a first-element-containing layer on a surface of the wafer 200 by contacting the TiCl$_4$ with the wafer 200.

The titanium-containing layer is formed to have a predetermined thickness and a predetermined distribution according to, for example, a pressure in the processing container 202, a flow rate of the TiCl$_4$ gas, a temperature of a susceptor 217, and a processing time in the first processing area 201a.

After a predetermined time has elapsed, the first gas supply system closes the valve 243d and stops the supply of the TiCl$_4$ gas. The second gas supply system maintains the valve 247d open and keeps supplying the inert gas. The third gas supply system maintains the valve 245d open and keeps supplying the inert gas.

(First Shower Head Exhaust Process S204)

An atmosphere in the shower head 230 is exhausted by stopping the supply of the TiCl$_4$ gas and then opening the valve 237. Specifically, the atmosphere in the buffer chamber 232 is exhausted. In this case, the vacuum pump 239 is previously activated. The shower head exhaust process S204 will be described later.

In this case, the valve 237 and the vacuum pump 239 are controlled such that exhaust conductance from the first exhaust system in the buffer chamber 232 may be greater than exhaust conductance from the second exhaust system through the processing chamber. According to the control, a gas flow is formed from the middle of the buffer chamber 232 toward the shower head exhaust hole 231b. Thus, a gas adhering to a wall of the buffer chamber 232 or a gas floating in the buffer space is exhausted from the first exhaust system without entering into the processing chamber 201.

(First Processing Chamber Exhaust Process S206)

When a predetermined time has elapsed, the exhaust pump 224 of the second exhaust system is activated, and opening degrees of the APC valve 223 and the valve 237 are controlled such that the exhaust conductance from the second exhaust system in the processing space may be greater than exhaust conductance from the first exhaust system through the shower head 230. According to the control, a gas flow is formed toward the second exhaust system via the processing chamber 201. Accordingly, it is possible to reliably supply an inert gas supplied to the buffer chamber 232 onto the substrate, thereby increasing efficiency of removing a residual gas from the substrate.

The inert gas supplied in the processing chamber exhaust process removes, from the wafer 200, a titanium component that has not combined with the wafer 200 in the first processing gas supply process S202. The residual TiCl$_4$ gas in the shower head 230 is removed by opening the valve 237 and controlling the pressure regulator 238 and the vacuum pump 239. When a predetermined time has elapsed, the valve 237 is closed to separate the shower head 230 from the vacuum pump 239 while the valve 243d is closed to stop the supply of the inert gas.

More preferably, when a predetermined time has elapsed, the valve 237 may be closed while the exhaust pump 224 of the second exhaust system is activated. Thus, since a flow toward the second exhaust system via the processing chamber 201 is not affected by the first exhaust system, it is possible to reliably supply the inert gas onto the substrate, thereby further increasing efficiency of removing a residual gas from the substrate.

Moreover, the following effect may be obtained by performing the processing chamber exhaust process S206 after the shower head exhaust process S204. That is, since a residue is removed from the buffer chamber 232 in the shower head exhaust process S204, a residual gas may be blocked from adhering onto the substrate even when a gas flow passes through the wafer 200 in the processing chamber exhaust process S206.

(Second Processing Gas Supply Process S208)

The first gas supply system keeps supplying the inert gas while the valve 243d is closed and the valve 247d is opened. The backflow from the shower head 230 is prevented by supplying the inert gas.

The second gas supply system opens the valve 244d to start supplying ammonia gas while the remote plasma unit 244e is operated and the valve 247d is opened. The supplied ammonia gas is slowly mixed with the inert gas that is supplied from the second inert gas supply system. Accordingly, in a mixed gas of the inert gas and the ammonia gas, a flow rate ratio of the ammonia gas increases slowly.

The ammonia gas mixed with the inert gas is changed into plasma state by passing through the remote plasma unit 244e. An ion component of the ionized ammonia gas plasma is trapped by the ion trap unit 244f. Plasma that is mainly configured by a radical passing through the ion trap unit 244f is uniformly supplied onto the substrate through the buffer chamber 232 and the through hole 234a.

In this case, the mass flow controller 244c is controlled such that the flow rate of the ammonia gas may be equal to a predetermined flow rate. Also, the supplied flow rate of the ammonia gas is, for example, 200 to 1,500 sccm.

Here, the predetermined flow rate of the ammonia gas is a flow rate at which the mixed gas of the ammonia gas and the inert gas is easily changed into plasma state by the remote plasma unit 244e, or a flow rate at which the ion component is set to be decreased. This will be described later.

Ammonia gas plasma mainly configured by a radical generated by the remote plasma unit 244e is supplied onto the wafer 200. The previously formed titanium-containing layer is modified by the ammonia radical to form, for example, a layer containing the element titanium and the element nitrogen on the wafer 200. In this case, since an amount of ions of the supplied ammonia plasma is small, damage to the film due to ion bombardment may be reduced. Accordingly, this can be applied to a process sensitive to contamination or damage, such as a transistor manufacturing process.

The modified layer is formed to have a predetermined thickness, a predetermined distribution, and a depth of penetration of a nitrogen component into a titanium-containing layer according to, for example, a pressure in the processing container 202, a flow rate of the ammonia gas, a temperature of the substrate placing table 212, and a power supply state of the plasma generating part.

After a predetermined time has elapsed, the valve 244d is closed, and the supply of the ammonia gas is stopped.

Here, a relation between a flow rate ratio of the inert gas and the ammonia gas in the remote plasma unit 244e and the plasma state will be described with reference to FIG. 5. Reference number 301 indicates an inert gas, and reference number 302 indicates ammonia gas. The horizontal axis indicates a flow rate ratio, and the vertical axis indicates a time. The flow rate ratio of the inert gas is greater than that of the ammonia gas before the valve 244d is opened. As the valve 244d is opened, the flow rate ratio of the ammonia gas slowly increases.

As described above, the remote plasma unit 244e is set such that the generation of ions may be reduced at a predetermined range of flow rate ratios by previously adjusting a power source or matching box. For example, the remote plasma unit 244e may be set such that the generation of ions may be reduced when the flow rate ratio (inert gas/ammonia gas) of the inert gas to the ammonia gas is 1,500/200 to 1,500/750. This flow rate ratio is a flow rate ratio in a plasma-stable area of FIG. 5. When the flow rate ratio is out of the predetermined range, that is, the flow rate ratio is in an abnormal discharge area, a great amount of ions are generated.

For example, when the flow rate ratio of ammonia is less than the predetermined range, such as when the second processing gas supply process S208 is started or immediately after the valve 244d is opened, there exists an abnormal discharge area. Here, since ammonia does not reach the predetermined flow rate ratio, a great amount of ions are generated.

Furthermore, the abnormal discharge area includes a case in which the flow rate ratio of ammonia exceeds the predetermined range, that is, a gas remains upstream from the valve. According to the present embodiment, when the remaining gas is immediately mixed with the inert gas directly after the valve 244d is opened, the flow rate ratio of ammonia exceeds the predetermined range to cause abnormal discharge, thereby generating a great amount of ions.

As described above, since a great amount of ions are generated in the abnormal discharge area, ion damage to the film on the substrate is expected to be great. In particular, for the substrate processing process according to the present embodiment, as will be described later, a film having a desired thickness is formed by forming a single layer film in the first processing gas supply process S202 and the second processing gas supply process S208 and repeating the first processing gas supply process S202 and the second processing gas supply process S208 to stack thin films. In a case in which ions are generated when the ammonia gas is supplied as described above, ion damage occurs for each layer, and thus a film is formed to have poor characteristics in a depth direction as well as on a film surface.

Thus, in the present embodiment, the ion trap unit 244f is disposed downstream from the remote plasma unit. This may prevent the ions from being supplied onto the substrate even in a plasma ignition area in which the flow rate ratio of ammonia is low, such as when the second processing gas supply process S208 is started. Accordingly, it is possible to form a film having less damage or electrification due to ions even when the method of forming the film having a desired thickness is used including forming a single layer film in the first processing gas supply process S202 and the second processing gas supply process S208 and repeating the first processing gas supply process S202 and the second processing gas supply process S208 to stack thin films.

The third gas supply system opens the valve 245d and starts supplying an inert gas as a third processing gas into the processing chamber 201 through the gas introduction hole 241, the buffer chamber 232, and the plurality of through holes 234a.

(Second Shower Head Exhaust Process S210)

An atmosphere in the shower head 230 is exhausted by stopping the supply of the ammonia gas and then opening the valve 237. Specifically, the atmosphere in the buffer chamber 232 is exhausted. In this case, the vacuum pump 239 is previously activated. The shower head exhaust process S210 will be described later.

The valve 237 and the vacuum pump 239 are controlled such that exhaust conductance from the first exhaust system in the buffer chamber 232 may be greater than exhaust conductance of the exhaust pump 224 through the processing chamber. According to the control, a gas flow is formed from the middle of the buffer chamber 232 to the shower head exhaust hole 231b. Thus, a gas adhering to a wall of the buffer chamber 232 or a gas floating in the buffer space is exhausted from the first exhaust system without entering the processing chamber 201.

(Second Processing Chamber Exhaust Process S212)

When a predetermined time has elapsed, the exhaust pump 224 of the second exhaust system is activated, and opening degrees of the APC valve 223 and the valve 237 are controlled such that the exhaust conductance from the second exhaust system in the processing space may be greater than exhaust conductance from the first exhaust system through the shower head 230. According to the control, a gas flow is formed toward the second exhaust system via the processing chamber 201. Accordingly, it is possible to reliably supply an inert gas supplied to the buffer chamber 232 onto the substrate, thereby increasing efficiency of removing a residual gas from the substrate.

The inert gas supplied in the processing chamber exhaust process removes, from the wafer 200, a titanium component that has not combined with the wafer 200 in the first processing gas supply process S202. The residual ammonia gas in the shower head 230 is removed by opening the valve 237 and controlling the pressure regulator 238 and the vacuum pump 239. When a predetermined time has elapsed, the valve 237 is closed to separate the shower head 230 from the vacuum pump 239 while the valve 243d is closed to stop the supply of the inert gas.

More preferably, when a predetermined time has elapsed, the valve 237 may be closed while the exhaust pump 224 of the second exhaust system is activated. Thus, the residual gas in the buffer chamber 232 and the supplied inert gas may flow to the second exhaust system via the processing chamber 201 without influence from the first exhaust system, thereby more reliably supplying the inert gas onto the substrate. Accordingly, it is possible to more efficiently remove the residual gas that has not reacted with the first gas from the substrate.

Moreover, the following effect may be obtained by continuously performing the processing chamber exhaust process S206 after the shower head exhaust process S204. That is, since a residue is removed from the buffer chamber 232 in the shower head exhaust process S204, a residual gas may be blocked from adhering to the substrate even when a gas flow passes through the wafer 200 in the processing chamber exhaust process S206.

(Determination Process S214)

The controller 260 determines whether the cycle has been performed a predetermined number of times.

When the cycle has not been performed the predetermined number of times (No in S214), a cycle including the first processing gas supply process S202, the first shower head exhaust process S204, the first processing chamber exhaust process S206, the second processing gas supply process S208, the second shower head exhaust process S210, and the second processing chamber exhaust process S212 is repeated while the remote plasma unit 244e is operated. When the cycle has been performed the predetermined number of times (Yes in S214), the film forming process S104 is completed.

Here, a reason that the remote plasma unit 244e is operated while the cycle including the first processing gas supply process S202, the first shower head exhaust process S204, the first processing chamber exhaust process S206, the second processing gas supply process S208, the second shower head exhaust process S210, and the second processing chamber exhaust process S212 is repeated will be described.

In the alternate supply method according to the present embodiment, a single layer film (for example, about 0.36 Å) is formed by performing the first processing gas supply process S202 and the second processing gas supply process S208, and the first processing gas supply process S202 and the second processing gas supply process S208 need to be repeated several times in order to form a film having a desired thickness (for example, 50 Å). Thus, there is a limitation in that it takes a considerable time to obtain the film having a desired thickness. Accordingly, each processing gas supply process is required to be as short as possible in order to enhance processing efficiency.

In each processing gas supply process, for example, the first processing gas supply process requires about 0.05 seconds, the second processing gas supply process requires about 0.2 seconds, and the purge process therebetween requires about 0.3 seconds due to the nature of the processing gases or heating conditions. However, the remote plasma unit 244e for generating plasma in the second processing gas process requires several seconds (for example, 2 seconds) until the remote plasma unit 244e is activated and then stabilized. Accordingly, when the remote plasma unit 244e is stopped after the second processing gas supply process S208, there is a high possibility of the remote plasma unit 244e not being stabilized by the time the ammonia starts to be supplied in the second processing gas supply process S208. In this case, there is a problem in that an amount of exposure on the substrate is insufficient since unstable plasma is generated. Accordingly, in the present embodiment, the remote plasma unit 244e is continuously activated. Thus, the stable plasma can always be generated in the second processing gas supply process.

Figure 6:
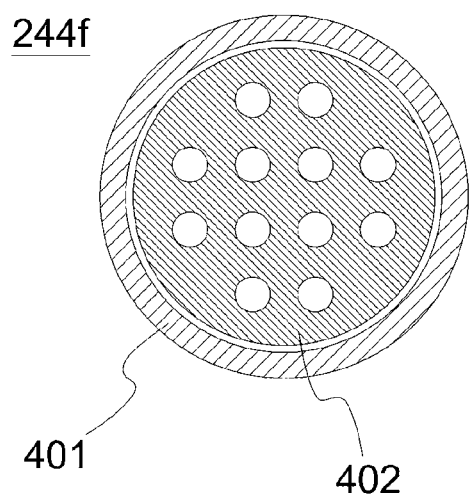
FIG. 6 is a view illustrating an ion trap unit according to a first embodiment of the present invention.

Next, the ion trap unit of the present embodiment will be described with reference to FIG. 6. A pipe 401 is connected to the second gas supply pipe 244a, or is a portion of the second gas supply pipe 244a. A perforated plate 402 is disposed inside the pipe 401. Each hole in the perforated plate has a diameter and a depth that are configured to trap ions of plasma passing through the hole. The configuration depends on characteristics of ions included in the supplied gas.

Second Embodiment of the Present Invention

Figure 7:
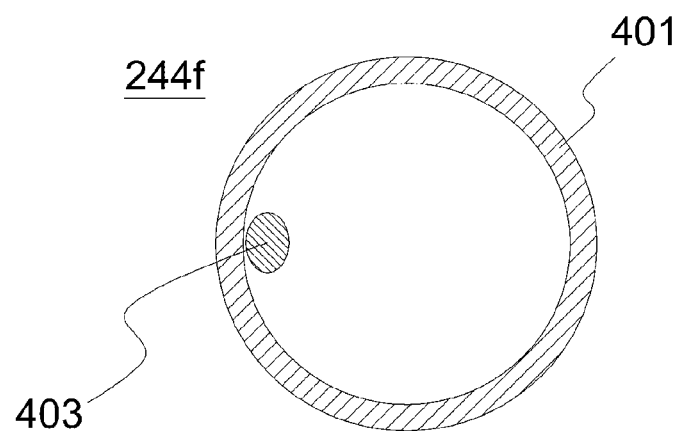
FIG. 7 is a view illustrating an ion trap unit according to a second embodiment of the present invention.

Next, an ion trap unit of the second embodiment according to the present invention will be described with reference to FIG. 7. The remaining components are the same as those of the first embodiment and thus will not be described. The ion trap unit of the second embodiment has a pole type conductive member 403 disposed inside the pipe 401. The pole type conductive member 403 is connected to the earth and configured to trap ions in plasma passing through the pipe 401.

The pole type conductive member 403 for trapping ions protrudes in the middle of the pipe 401. Thus, ions in plasma flowing in the middle of the pipe 301 can be trapped. An area through which a gas passes is greater than one of the embodiment of FIG. 6, thereby further increasing a flow velocity of a gas.

Third Embodiment of the Present Invention

Figure 8:
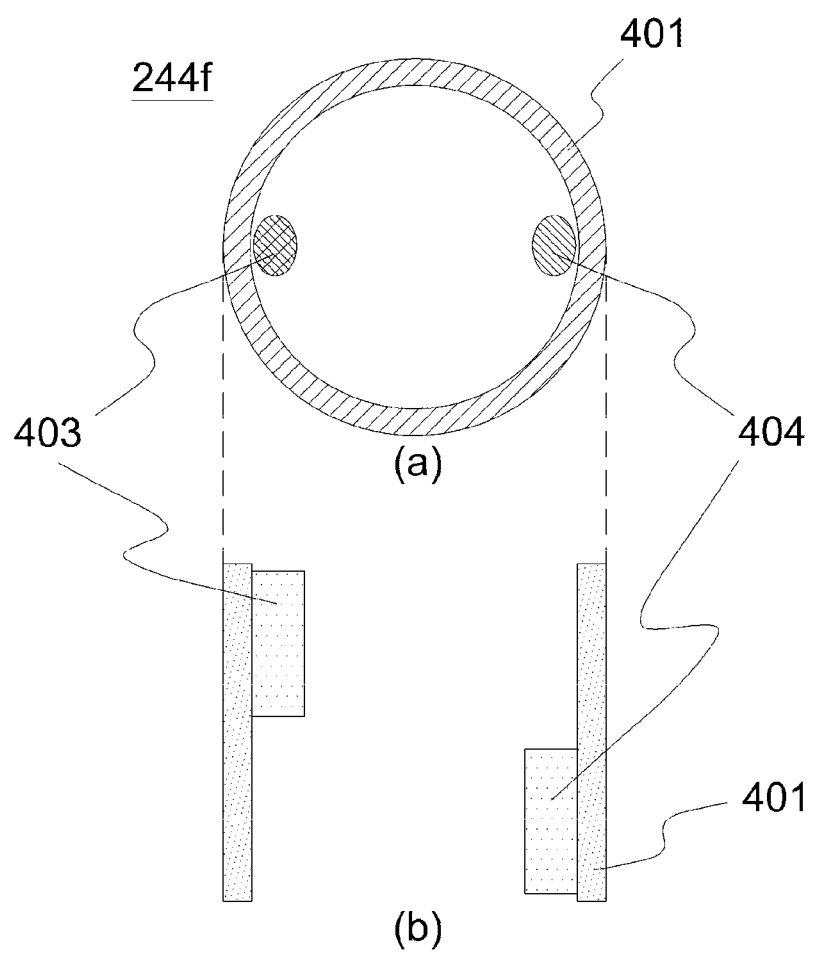
FIG. 8 is a view illustrating an ion trap unit according to a third embodiment of the present invention.

Next, an ion trap unit of the third embodiment according to the present invention will be described with reference to FIG. 8. The remaining components are the same as those of the first embodiment and thus will not be described. A portion (a) of FIG. 8 is a horizontal sectional view of the pipe 401, and a portion (b) of FIG. 8 is a vertical sectional view of the pipe 401. The ion trap unit of the third embodiment is formed by adding a pole type conductive member 403 to the ion trap unit described in FIG. 7. The pole type conductive member 403 is disposed to face the pole type conductive member 404 in a horizontal direction and disposed at a position different from the pole type conductive member 404 in a vertical direction.

Ions in plasma passing through the pipe 401 are trapped by the pole type conductive member 403, and ions in plasma passing through an area far from the conductive member 403 are trapped by the pole type conductive member 404.

In the embodiment described above, an example of forming a titanium nitride film on the wafer 200 using a titanium-containing gas as a first-element-containing gas and a nitride-containing gas as a second-element-containing gas has been described. However, the present invention is not limited thereto. A high-k film such as a hafnium oxide (HfO) film, a zirconium oxide (ZrO) film, and a titanium oxide (TiO) film may be formed on the wafer 200 using silicon (Si), a hafnium (Hf)-containing gas, a zirconium (Zr)-containing gas, and a titanium (Ti)-containing gas as the first-element-containing gas.

In addition, in the above-described embodiment, the shower head exhaust hole 231b connected to the first exhaust system is disposed in the cap 231 of the shower head. However, the present invention is not limited thereto. For example, the shower head exhaust hole 231b may be disposed at a side of the buffer chamber.

According the present invention, a substrate processing apparatus and a method of manufacturing a semiconductor device can be provided which can form a high-quality film having little ion damage.

Hereinafter, exemplary embodiments of the present invention will be described as a supplementary note.

(Supplementary Note 1)

There is provided a substrate processing apparatus including:
  a source gas supply system including a source gas supply pipe connected to a source gas source and a source gas supply controller disposed at the source gas supply pipe;
  a reactive gas supply system including:
    a reactive gas supply pipe connected to a reactive gas source, a reactive gas supply controller, a plasma generation unit and an ion trap unit, wherein the reactive gas supply controller, the plasma generation unit and the ion trap unit are arranged in order along a downstream direction of the reactive gas supply pipe; and
    an inert gas supply pipe whereat an inert gas supply controller is disposed, the inert gas supply pipe having a downstream side connected to the reactive gas supply pipe between the reactive gas supply controller and the plasma generation unit and an upstream side connected to an inert gas supply source;
  a processing chamber configured to accommodate a substrate to be processed, the processing chamber being supplied with a source gas by the source gas supply system and a reactive gas by the reactive gas supply system; and
  a control unit configured to control at least the source gas supply controller, the reactive gas supply controller and the inert gas supply controller.

(Supplementary Note 2)

The substrate processing apparatus of Supplementary note 1, wherein the control unit controls at least the source gas supply controller, the reactive gas supply controller and the inert gas supply controller to perform: (a) supplying the source gas into the processing chamber by the source gas supply system and an inert gas into the processing chamber by the reactive gas supply system while the plasma generation unit is operated; and (b) starting a supply of the reactive gas while the plasma generation unit is operated and the inert gas is supplied after the step (a).

(Supplementary Note 3)

The substrate processing apparatus of Supplementary note 2, wherein the control unit controls at least the source gas supply controller, the reactive gas supply controller and the inert gas supply controller to repeat the steps (a) and (b).

(Supplementary Note 4)

The substrate processing apparatus of Supplementary note 2 or 3, further including a nonreactive gas supply system including a nonreactive gas supply pipe connected to a nonreactive gas supply controller configured to control a supply of a nonreactive gas via the nonreactive gas supply pipe, wherein the control unit controls at least the source gas supply controller, the reactive gas supply controller, the inert gas supply controller and the nonreactive gas supply controller to further perform (c) supplying the nonreactive gas via the nonreactive gas supply pipe into the processing chamber between the steps (a) and (b) with the plasma generation unit activated while the steps (a), (b) and (c) are performed.

(Supplementary Note 5)

The substrate processing apparatus of Supplementary note 1, wherein the control unit controls at least the source gas supply controller, the reactive gas supply controller and the inert gas supply controller to perform: (a) supplying the source gas into the processing chamber by the source gas supply system and an inert gas into the processing chamber by the reactive gas supply system while the plasma generation unit is operated; and (d) supplying a mixture of the inert gas and the reactive gas to the plasma generation unit after supplying the inert gas while the plasma generation unit remains operated after the step (a).

(Supplementary Note 6)

There is provided a method of manufacturing a semiconductor device, including:

(a) loading a substrate into a processing chamber;

(b) supplying a source gas into the processing chamber by a source gas supply system; and (c) starting a supply of a reactive gas while an inert gas is supplied and supplying a mixture of the inert gas and the reactive gas into the processing chamber via a plasma generation unit and an ion trap unit disposed in a reactive gas supply system with the plasma generation unit and the ion trap unit operated.

(Supplementary Note 7)

There is provided a method of manufacturing a semiconductor device, the method including:

(a) loading a substrate into a processing chamber;

(b) supplying a source gas into the processing chamber by a source gas supply system and supplying an inert gas into the processing chamber via the plasma generation unit and the ion trap unit with the plasma generation unit and the ion trap unit operated; and (c) starting a supply of a reactive gas while the inert gas is supplied and supplying a mixture of the inert gas and the reactive gas into the processing chamber via a plasma generation unit and an ion trap unit with the plasma generation unit and the ion trap unit operated.

What is claimed is:

1. A substrate processing apparatus comprising:
a source gas supply system including a source gas supply pipe connected to a source gas source and a source gas supply controller disposed at the source gas supply pipe;

a reactive gas supply system including:
a reactive gas supply pipe connected to a reactive gas source, a reactive gas supply controller, a plasma generator and an ion trap device, wherein in the following order the reactive gas supply controller, the plasma generator and the ion trap device are arranged in order along a downstream direction of the reactive gas supply pipe thereby to prevent ion damage to a substrate; and an inert gas supply pipe whereat an inert gas supply controller is disposed, the inert gas supply pipe having a downstream side connected to the reactive gas supply pipe between the reactive gas supply controller and the plasma generator and an upstream side connected to an inert gas supply source;

a processing chamber configured to accommodate a substrate to be processed, the processing chamber being supplied with a source gas by the source gas supply system and a reactive gas by the reactive gas supply system; and a controller configured to control at least the source gas supply controller, the reactive gas supply controller and the inert gas supply controller.

2. The substrate processing apparatus of claim 1, wherein the controller controls at least the source gas supply controller, the reactive gas supply controller and the inert gas supply controller to perform: (a) supplying the source gas into the processing chamber by the source gas supply system and an inert gas into the processing chamber by the reactive gas supply system while the plasma generator is operated; and (b) starting a supply of the reactive gas while the plasma generator is operated and the inert gas is supplied after the step (a).

3. The substrate processing apparatus of claim 2, wherein the controller controls at least the source gas supply controller, the reactive gas supply controller and the inert gas supply controller to repeat the steps (a) and (b).

4. The substrate processing apparatus of claim 2, further comprising a nonreactive gas supply system including a nonreactive gas supply pipe connected to a nonreactive gas supply controller configured to control a supply of a nonreactive gas via the nonreactive gas supply pipe, wherein the controller controls at least the source gas supply controller, the reactive gas supply controller, the inert gas supply controller and the nonreactive gas supply controller to further perform (c) supplying the nonreactive gas via the nonreactive gas supply pipe into the processing chamber between the steps (a) and (b) with the plasma generator activated while the steps (a), (b) and (c) are performed.

5. The substrate processing apparatus of claim 3, further comprising a nonreactive gas supply system including a nonreactive gas supply pipe connected to a nonreactive gas supply controller configured to control a supply of a nonreactive gas via the nonreactive gas supply pipe, wherein the controller controls at least the source gas supply controller, the reactive gas supply controller, the inert gas supply controller and the nonreactive gas supply controller to further perform (c) supplying the nonreactive gas via the nonreactive gas supply pipe into the processing chamber between the steps (a) and (b) with the plasma generator unit operated while the steps (a), (b) and (c) are performed.

6. The substrate processing apparatus of claim 1, wherein the controller controls at least the source gas supply controller, the reactive gas supply controller and the inert gas supply controller to perform: (a) supplying the source gas into the processing chamber by the source gas supply system and an inert gas into the processing chamber by the reactive gas supply system while the plasma generator is activated; and (d) supplying a mixture of the inert gas and the reactive gas to the plasma generator after supplying the inert gas while the plasma generator remains operated after the step (a).

* * * * *